United States Patent
Baba et al.

(10) Patent No.: US 9,329,240 B2
(45) Date of Patent: May 3, 2016

(54) BATTERY SOC ESTIMATION DEVICE

(75) Inventors: Atsushi Baba, Saitama (JP); Shuichi Adachi, Yokohama (JP)

(73) Assignees: CALSONIC KANSEI CORPORATION, Saitama (JP); KEIO UNIVERSITY, Tokyo (JP)

( * ) Notice: Subject to any disclaimer, the term of this patent is extended or adjusted under 35 U.S.C. 154(b) by 497 days.

(21) Appl. No.: 13/978,240

(22) PCT Filed: Dec. 1, 2011

(86) PCT No.: PCT/JP2011/077748
§ 371 (c)(1),
(2), (4) Date: Jul. 3, 2013

(87) PCT Pub. No.: WO2012/098770
PCT Pub. Date: Jul. 26, 2012

(65) Prior Publication Data
US 2013/0297243 A1    Nov. 7, 2013

(30) Foreign Application Priority Data
Jan. 18, 2011 (JP) ................. 2011-007874

(51) Int. Cl.
*G01R 31/36* (2006.01)
*B60L 11/18* (2006.01)
(Continued)

(52) U.S. Cl.
CPC ........... *G01R 31/361* (2013.01); *B60L 11/1861* (2013.01); *G01R 31/3624* (2013.01);
(Continued)

(58) Field of Classification Search
CPC ............ B60L 11/1861; G01R 31/3524; G01R 31/361; G01R 31/3651; H01M 10/48; Y02T 10/705; Y02T 10/7044; H02J 7/044
USPC ............ 702/63; 320/132, 157, 109, 162, 149; 180/65.1, 65.29, 116
See application file for complete search history.

(56) References Cited

U.S. PATENT DOCUMENTS

| 5,617,007 A * | 4/1997 | Keidl ................. H01M 10/44 320/141 |
| 6,127,806 A * | 10/2000 | Tanjo ................. G01R 31/3675 320/132 |

(Continued)

FOREIGN PATENT DOCUMENTS

| CN | 1503399 | 6/2004 |
| CN | 1820207 | 8/2006 |

(Continued)

OTHER PUBLICATIONS

Chinese Office Action dated Dec. 23, 2014 in corresponding Chinese Office Action 201180065424.0.

(Continued)

*Primary Examiner* — Carol S Tsai
(74) *Attorney, Agent, or Firm* — Wenderoth, Lind & Ponack, L.L.P.

(57) ABSTRACT

A battery SoC estimation device includes a discharge-and charge current detection means 1, a terminal-voltage detection means 2, a current-integration SoC estimation means 3, an open-circuit-voltage SoC estimation means 4, an error estimation means 6, and an SoC calculating means 7. The estimation means 3 estimates a current-integration-method SoC ($SoC_i$), calculating variance of current-integration-method SoC based on information on detection accuracy of the detection means 1. The estimation means 4 estimates an open-circuit-voltage-method SoC ($SoC_v$) corresponding to an open circuit voltage value estimated based on a discharge-and-charge current value and a terminal voltage value, using a battery equivalent circuit model. The estimation means 6 estimates an estimate error $n_i$ of the current-integration-method SoC based on a difference between the $SoC_v$ and the $SoC_i$, variance of the $SoC_i$, and variance of the $SoC_v$. The calculating means 7 calculates SoC of a battery based on the $SoC_i$ and the $n_i$.

4 Claims, 5 Drawing Sheets

(51) Int. Cl.
*H02J 7/04* (2006.01)
*H01M 10/48* (2006.01)

(52) U.S. Cl.
CPC ........... *G01R31/3651* (2013.01); *H01M 10/48* (2013.01); *H02J 7/044* (2013.01); *Y02T 10/7005* (2013.01); *Y02T 10/705* (2013.01); *Y02T 10/7044* (2013.01)

(56) References Cited

U.S. PATENT DOCUMENTS

| | | | | |
|---|---|---|---|---|
| 6,359,419 | B1* | 3/2002 | Verbrugge | B60K 6/44 320/132 |
| 6,531,875 | B2* | 3/2003 | Satake | G01R 31/3637 324/429 |
| 6,845,332 | B2* | 1/2005 | Teruo | G01R 31/3648 320/132 |
| 7,009,402 | B2* | 3/2006 | Yumoto | G01R 31/36 324/433 |
| 7,352,156 | B2* | 4/2008 | Ashizawa | G01R 31/361 320/132 |
| 7,830,119 | B2* | 11/2010 | Naik | G01R 31/3648 320/132 |
| 7,880,442 | B2* | 2/2011 | Takeuchi | H01M 10/06 180/116 |
| 7,982,433 | B2* | 7/2011 | Lim | G01R 31/361 320/132 |
| 8,207,706 | B2* | 6/2012 | Ishikawa | G01R 31/3624 320/132 |
| 8,738,311 | B2* | 5/2014 | Wu | G01R 31/3651 702/108 |
| 9,207,284 | B2* | 12/2015 | Baba | G01R 31/3651 |
| 2002/0084785 | A1* | 7/2002 | Park | H02J 7/1461 324/433 |
| 2007/0029973 | A1* | 2/2007 | Ashizawa | G01R 31/361 320/132 |
| 2008/0254347 | A1* | 10/2008 | Palladino | H01M 10/48 429/90 |
| 2009/0115376 | A1* | 5/2009 | Takeuchi | H01M 10/06 320/157 |
| 2010/0138178 | A1 | 6/2010 | Paryani et al. | |
| 2010/0318252 | A1* | 12/2010 | Izumi | B60K 6/28 701/22 |

FOREIGN PATENT DOCUMENTS

| | | |
|---|---|---|
| CN | 101807802 | 8/2010 |
| JP | 2005-083970 | 3/2005 |
| JP | 2006-20401 | 1/2006 |
| JP | 2009-250970 | 10/2009 |
| JP | 2010-203854 | 9/2010 |
| JP | 2010-271286 | 12/2010 |
| WO | 2005/006006 | 1/2005 |
| WO | 2010/140044 | 12/2010 |

OTHER PUBLICATIONS

International Search Report mailed Mar. 13, 2013 in International (PCT) Application No. PCT/JP2011/077748.

Extended European Search Report issued Nov. 9, 2015 in corresponding European Pateut Application No. 11855964.0.

* cited by examiner

BATTERY SOC ESTIMATION DEVICE

TECHNICAL FIELD

The present invention relates to a battery SoC estimation device that estimates the State of Charge of a battery used for electric vehicles and the likes.

BACKGROUND OF THE INVENTION

For example, in electric vehicles, hybrid electric vehicles and the likes, a rechargeable battery (a second battery) is used for supplying electric power to an electric motor that drives the vehicles and accumulating electric energy charged from the electric motor functioning as a generator to recover braking energy or from power sources provided on the ground.

In this case, it is necessary to carry out battery management by always monitoring the state of battery, especially the State of Charge (SoC) to maintain the battery in a good state over long periods.

A current integration method (a Coulomb counting method or a sequential state recording method) and an open-circuit voltage method are known as conventional methods for detecting the SoC. Specifically, in the current integration method, input and output of voltage and current of the battery are recorded as time series data, which is used for calculating the present amount of electric charge by time-integrating the current, and then the Soc is obtained based on the initial amount of electric charge charged in the battery and the full charge capacity. In the open circuit voltage method, the inputted current values and terminal voltage values of the battery are inputted, and using a battery equivalent model, the open circuit voltage values are sequentially estimated as the state quantity of the model. Then the SoC is estimated based on the open circuit voltage.

The methods described above have both merits and demerits: the estimate accuracy for a short time is higher in the former current integration method than that in the latter open circuit voltage method where the SoC is estimated, using the open circuit voltage, but the former needs to always observe, and the error becomes to be accumulated, which deteriorates its accuracy. On the other hand, the latter open circuit voltage method does not need to always observe, but the accuracy is inferior to that of the former current integration method when the change amount of charge in a short time is estimated, because the variation of the open circuit voltage is small relative to the change of the SoC.

One of the conventional battery SoC estimation device is known (for example, see the Patent Document 1), which includes a first electric quantity calculation means, a second electric quantity calculation means, and an offset amount estimation means. The first electric quantity calculation means calculates the SoC of a battery based on an open circuit voltage estimate value estimated based on the discharge-ad-charge current and the terminal voltage of the battery by the open circuit voltage method using an adaptive filter, then calculating the change amount of electric quantity charged in the battery based on the SoC.

The second electric quantity calculation means uses the current integration method to time-integrate the discharge-and-charge current of the battery and calculate the change amount of electric quantity charged in the battery based on the value of integral. The offset amount estimation means estimates the offset amount as the observed-value error of the discharge current measuring equipment based on the difference between the change amounts of the electric quantities respectively obtained by the calculation means. The device improves the estimate accuracy of the inner state of the battery such as the SoC, by suppressing the observed-value error of the discharge current measuring equipment to a small extent by compensating the offset amount to improve the accuracy of the detected current value.

In addition, the other of the conventional SoC estimation methods is known (for example, see the Patent Document 2), which includes a step of obtaining the information on a battery, a step of calculating integrated capacity, a step of judging compensation right-or-wrong, and a step of compensating the integrated value. In the step of obtaining the information on a battery, the information on the battery (current value, voltage value, temperature value) is observed. In the step of calculating integrated capacity, the current integration value is calculated by integrating the compensated current value compensated by using the voltage value. In the step of judging compensation right-or-wrong, the compensation of the current integration capacity is judged right or wrong based on the forward voltage capacity of the battery calculated based on the battery information. In the step of compensating the integrated value, the remaining capacity of the battery by compensating or not compensating the current integration capacity according to the judgment result. The device improves the calculation accuracy of the SoC by compensating the observed error of the battery information.

PRIOR ART DOCUMENT

Patent Document

Patent Document 1: Japanese Patent Application Laid-Open No. 2010-203854
Patent Document 2: Japanese Patent Application Laid-Open No. 2009-250970

DISCLOSURE OF THE INVENTION

Problem(s) to be Solved by the Invention

However, in the SoC estimation device of the former prior art, the change amounts of the electric charge estimated by the current integration method and the open circuit voltage method using the adaptive filter are compared with each other to obtain a difference, on which the error value of the current detection part (an offset amount of the observed current value) is estimated based.

However, the estimated values, such as the electric quantities obtained by the above-described methods, have different statistical characteristics, so that the error due to the statistical characteristics cannot be avoided when the electric quantities obtained by the above-described methods and being unchanged are compared with each other. The detection error of the discharge current measuring equipment cannot be estimated with a high degree of accuracy, consequently there is a problem in the deterioration in the estimate accuracy of the SoC of the battery.

In the SoC estimation device of the latter prior art, the characteristics of the discharge current measuring equipment varies according to the duration of use, the status of use, the environment of usage, and so on, and in addition the variation of individual difference cannot be avoided. Nevertheless, in the method of this prior art, the above-described estimation is carried out, assuming that every discharge current measuring equipment has the same characteristics. Therefore, it cannot be sufficiently used for estimating the error of the detection value due to the difference from the actual characteristics, and the detection error of the discharge current measuring equipment cannot be estimated with a high degree of accuracy. Consequently, there is also a problem in the deterioration in the estimate accuracy of the SoC of the battery.

The present invention is made to solve the above-described problems, and its object is to provide a battery SoC estimation device that can estimate the SoC of a battery with a high degree of accuracy regardless of variation and variability of the characteristics of a discharge-and charge current detecting means.

Means for Solving the Problems

In order to achieve the object, a battery State-of-Charge estimation device of claim 1 includes: a discharge-and-charge current detection means that detects a discharge-and-charge current value of a battery; a terminal voltage detection means that detects a terminal voltage value of the battery, a current-integration-method State-of-Charge estimation means that estimates a current-integration-method State-of-Charge based on a State-of-Charge obtained by integrating the discharge-and-charge current value inputted from the discharge-and-charge current detection means and a State-of-Charge obtained at previous time, calculating a variance of the current-integration-method State-of-Charge based on information on a detection accuracy of the discharge-and-charge current detection means; an open-circuit-voltage method State-of-Charge estimation means that estimates an open-circuit-voltage State-of-Charge based on the discharge-and-charge current value inputted from the discharge-and-charge current detection means and the terminal voltage value inputted from the terminal voltage detection means, using a battery equivalent circuit model, the open-circuit-voltage method State-of-Charge estimation means calculating a variance of the open-circuit-voltage method State-of-Charge based on information of detection accuracy of the discharge-and-charge current detection means and the terminal voltage detection means; an error estimation means that estimates an estimate error of the current-integration-method State-of-Charge based on a difference between the open-circuit-voltage method State-of-Charge and the current-integration-method State-of-Charge, the variance open-circuit-voltage method State-of-Charge of current-integration-method State-of-Charge, and the variance of and a State-of-Charge calculating means that calculates a State-of-Charge of the battery based on the current-integration-method State-of-Charge and the estimate error estimated by the error estimation means.

The battery State-of-Charge estimation device of claim 2, in the device of claim 1, the open-circuit-voltage-method State-of-Charge estimation means and the error estimation means use Kalman filters, respectively.

The battery State-of-Charge estimation device of claim 3, in the device of claim 1 or 2, the current-integration-method State-of-Charge estimation means estimates the current-integration-method State-of-Charge, using the State-of-Charge that is previously obtained by the State-of-Charge calculating means.

Effect of the Invention

In the battery State-of-Charge estimation device of claim 1, when the current-integration-method State-of-Charge estimation means and the open-circuit-voltage-method State-of-Charge estimation means respectively estimate the current-integration-method State-of-Charge and the open-circuit-voltage-method State-of-Charge, they are statistically computed, using the mean value and the variance. Therefore, it can estimate the State of Charge of the battery with a higher degree of accuracy relative to that of the prior art even when the discharge-and-charge current detection means and the terminal-voltage detection means the variation or the variability in their characteristics.

In the battery State-of-Charge estimation device of claim 2, the open-circuit-voltage-method State-of-Charge estimation means and the error estimation means use Kalman filters, and it is not necessary to separately calculate therefore the mean estimate value and the estimate variance value because they are originally and constantly calculated by the Kalman filters.

In the battery State-of-Charge estimation device of claim 3, the current-integration-method State-of-Charge estimation means estimates the current-integration-method State-of-Charge, using the State-of-Charge that is obtained by the State-of-Charge calculating means, and therefore the current-integration-method State-of-Charge can be estimate with a high degree of accuracy.

BEST MODE FOR CARRYING OUT THE INVENTION

Hereinafter, modes for carrying out the invention will be in detail explained based on the accompanying drawings.

First Embodiment

Figure 1:
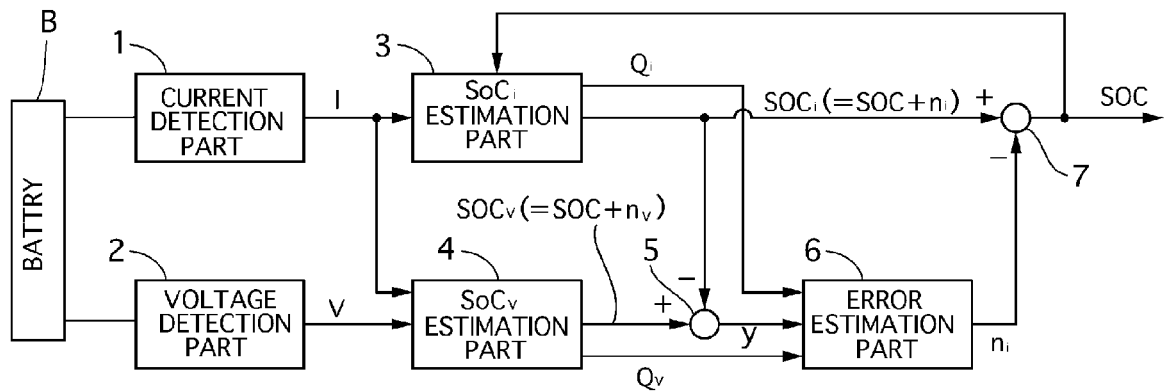
FIG. 1 is a bock diagram showing a construction of a battery SoC estimation device of a first embodiment according to the present invention.

FIG. 1 shows a battery SoC estimation device of a first embodiment. As shown in FIG. 1, the SoC estimation device, which is connected to a battery B, includes a discharge-and-charge current detection part 1, a terminal voltage detection part 2, a current-integration-method SoC estimation part 3, an open-circuit-voltage-method SoC estimation part 4, a subtracter 5, an error estimation part 6, and a subtracter 7.

The battery B employs a rechargeable battery such as a lithium ion battery in this embodiment, to which is not limited. It may employ a nickel hydrogen battery, or other kinds of batteries.

The discharge-and-charge current detection part 1 detects a discharge current value in a case where the battery B supplies electric power to a not-shown electric motor and so on and a charge current value in a case where a part of brake energy is recovered by the electric motor functioning as a generator when a vehicle is braking and where the battery B is charged from a power source equipment on the ground. It detects the discharge-and-charge current value I of the current that flows in and to the battery B by using a shunt resistance or others. The detected discharge-and-charge current value I is inputted as input signal to both of the current-integration-method SoC estimation part 3 and the open-circuit-voltage-method SoC estimation part 4.

Incidentally, the current detection part 1 may appropriately employ various constructions and types, and it corresponds to a discharge-and-charge current detection means of the invention.

The terminal voltage detection part 2 detects a terminal voltage value of the battery B. The detected voltage value V is inputted to the open-circuit-voltage-method SoC estimation part 4.

Incidentally, the terminal voltage detection part 2 may appropriately employ various constructions and types, and it corresponds to a terminal voltage detection means of the invention.

The current-integration-method SoC estimation part 3 is inputted with the SoC of the battery finally obtained by the subtracter 7 and the discharge-and-charge current I detected by the discharge-and-charge current 1 to calculate the current integration value by integrating the discharge-and-charge current I and obtain the charge amount. Then it calculates the current-integration-method SoC ($SoC_i$) based on the charge amount and the SoC inputted from the subtracter 7, and it obtains a current-integration-method variance $Q_i$ based on the information q (see FIG. 2) on a detection accuracy of the discharge-and-charge current detection part 1 which is obtained in advance.

Incidentally, the current-integration-method SoC ($SoC_i$) has a value in which the true SoC is superposed with the estimate error $n_i$. The current-integration-method SoC estimation part 3 corresponds to a current-integration-method State-of-Charge estimation means of the invention.

Figure 2:
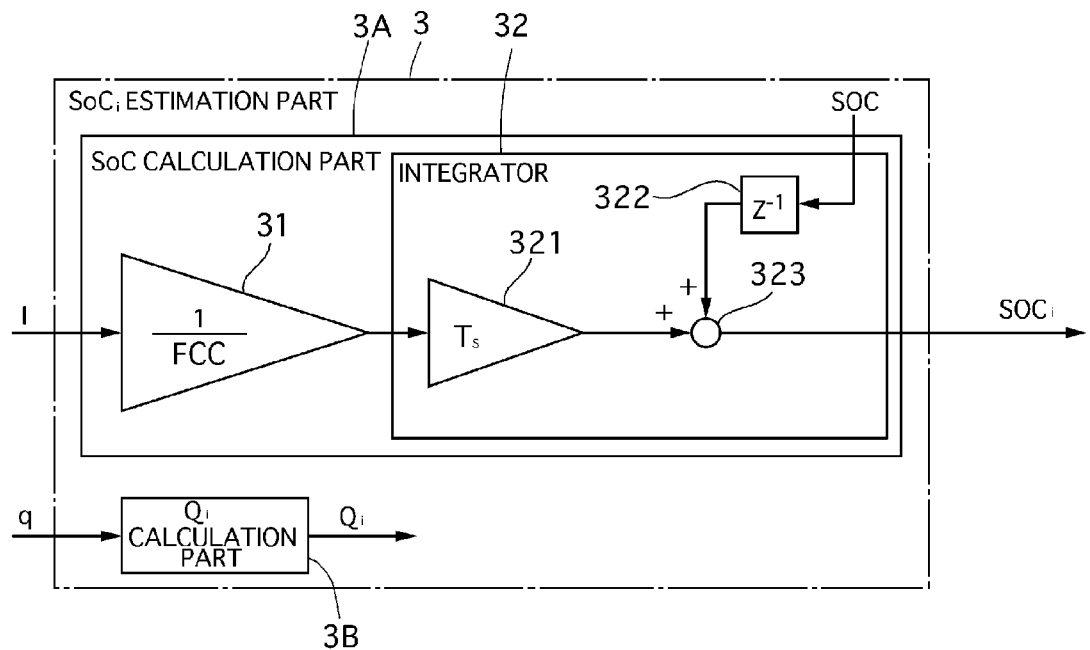
FIG. 2 is a block diagram showing a construction of a current-integration-method SoC calculation part that is used the battery SoC estimation device of the first embodiment.

FIG. 2 shows a concrete construction of the current-integration-method SoC estimation part 3. As shown in FIG. 2, the current-integration-method SoC estimation part 3 includes a SoC calculating part 3A consisting of a coefficient multiplier 31 and an integrator 32, and a current-integration-method variance calculating part 3B. The integrator 2 has a multiplier 321, a delay part 322, and an adder 323. The multiplier 31 multiplies the discharge-and-charge current I (the mean value) obtained every computation period from the discharge-and-charge current detection part 1 by a coefficient 1/FCC. The coefficient FCC is a full charge amount of the battery B, and it may be either a nominal value (the value when it is new) or the value allowed for the State of Degradation.

The multiplier 321 of the integrator 32 multiplies the output value outputted from the coefficient multiplier 31 by the computation period $T_s$, the output value being the present SoC. The delay part 322 multiplies the SoC obtained by the subtractor 7 by 1/z (z indicates z transformation) to obtain the previous SoC. The adder 323 adds the output value outputted from the multiplier 321 and the output value outputted from the delay part 322 to output the current-integration-method SoC ($SoC_i$).

On the other hand, the current-integration-method variance calculating part 3B calculates a current-integration-method variance Qi based on the information q on a detection accuracy of the discharge-and-charge current detection part 1, which is obtained in advance. In this calculation, the operation of recurrent matrix is carried out, using the following equations.

Incidentally, in the following equations, P is covariance matrix, F is state transition matrix, Q is noise matrix, $T_s$ is computation period, an additional character is time, and a superscript additional character is a symbol expressing transposition. Herein, $Q_i$ is obtained as $P_{11}$ in the covariance matrix P.

$$P_{k+1} = FP_kF^T + Q \qquad \text{<Eq. 1>}$$

$$P = \begin{pmatrix} P_{11} & P_{12} \\ P_{21} & P_{22} \end{pmatrix}$$

$$F = \begin{pmatrix} 1 & T_s/FCC \\ 0 & 1 \end{pmatrix}$$

$$Q = \begin{pmatrix} 0 & 0 \\ 0 & q \end{pmatrix}$$

$$Q_i = P_{11}$$

The open-circuit-voltage-method SoC estimation part 4 estimates the open-circuit-voltage-method SoC ($SoC_v$) based on the discharge-and-charge current value I inputted from the terminal voltage detection part 2 every computation period Ts and the terminal voltage value V inputted from the terminal voltage detection part 2 every computation period Ts, using the battery equivalent circuit model of the battery B. In addition, it also calculates the variance POCV of the open circuit voltage value $V_{OCV}$ and the variance $P_{SOCV}$ ($=Q_v$) of the open-circuit-voltage-method SoC ($SoC_v$) based on the pre-given information on the detection accuracy of the discharge-and-charge current detection part 1 and the terminal voltage detection part 2. In this embodiment, the open-circuit-voltage-method SoC estimation part 4 employs a Kalman filter, which will be later explained. Incidentally, the open-circuit-voltage-method SoC estimation part 4 corresponds to a open-circuit-voltage-method State-of-Charge estimation part 4 of the invention.

Figure 3:
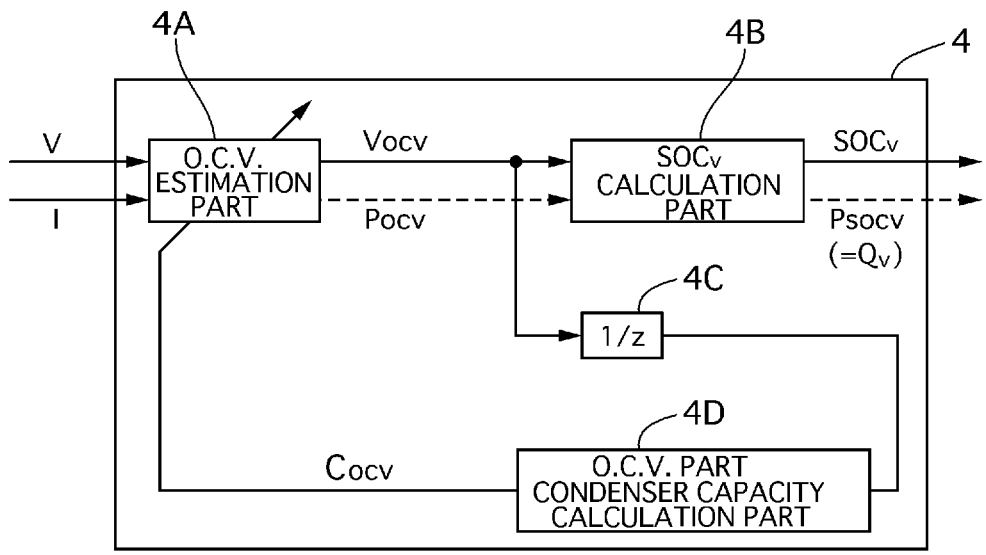
FIG. 3 is a block diagram showing a construction of an open-circuit-voltage-method SoC estimation part that is used in the battery SoC estimation device.

FIG. 3 shows a concrete construction of the open-circuit-voltage-method SoC estimation part 4. The open-circuit-voltage-method SoC estimation part 4 includes an open-circuit-voltage estimation part 4A, an SoC calculation part 4B, a delay part 4C, and an open-circuit-voltage-part condenser capacity calculation part 4D.

The open-circuit-voltage estimation part 4A estimates the open circuit voltage $V_{OCV}$ of the battery B based on the discharge-and-charge current value I inputted from the terminal voltage detection part 2 every computation period Ts, the terminal voltage value V inputted from the terminal voltage detection part 2 every computation period Ts and the open-circuit-voltage-part condenser capacity value $C_{OCV}$ inputted from the open-circuit-voltage-part condenser capacity calculation part 4D, using the Kalman filter. In addition, it also calculates the variance $P_{OCV}$ of the open circuit voltage based on the pre-given information on the detection accuracy of the discharge-and-charge current detection part 1 and the terminal voltage detection part 2.

The SoC calculation part 4B calculates the open-circuit-voltage-method SoC (SoC$_v$) based on the open circuit voltage value $V_{OCV}$, using the data of a relationship between the open circuit voltage value and the open-circuit-voltage-method SoC, which are measured and stored in advance. In addition, it also calculates the variance $P_{SOCV}$ of the open-circuit-voltage-method SoC (SoC$_v$) based on the variance $P_{OCV}$, of the open circuit voltage calculated by the open-circuit-voltage estimation part 4A. Incidentally, the open-circuit-voltage-method SoC (SoC$_v$) estimated by the SoC calculation part 4B has a value in which the true SoC is superposed with the estimate error $n_v$.

The display part 4C calculates the open circuit value immediately before the present one by multiplying the inputted open circuit voltage value $V_{OCV}$ estimated by the open-circuit-voltage estimation part 4A by 1/z. The open-circuit-voltage-part condenser capacity calculation part 4D calculates the open-circuit-voltage condenser capacity value $C_{OCV}$ of the battery B based on the open circuit voltage calculated by the delay part 4C to output it to the open-circuit-voltage estimation part 4A.

Incidentally, the open-circuit-voltage condenser capacity value $C_{OCV}$ is obtained by using the equation: COCV=[100× (an inclination of the open circuit voltage relative to the open-circuit-voltage-method SoC (SoC$_v$) obtained at the sampling time immediately before the present one)].

The subtracter 5 obtains the subtraction value y by the current-integration-method SoC (SoC$_i$) obtained by the current-integration-method SoC estimation part 3 from the open-circuit-voltage-method SoC (SoC$_v$) obtained by the open-circuit-voltage-method SoC estimation part 4 to output it to the error estimation part 6.

The error estimation part 6 estimates the estimate error $n_i$ of the current-integration-method SoC (SoC$_i$) based on the current-integration-method variance Q$_i$ obtained by the current-integration-method SoC estimation part 3, the subtraction value y obtained by the subtracter 5, and the open-circuit-voltage-method variance Q$_v$, using the Kalman filter. Incidentally, the error estimation part 6 also estimates the estimate error $n_v$ of the open-circuit-voltage-method SoC (SoC$_v$). The error estimation part 6 corresponds to an error estimation means of the invention.

Herein, the Kalman filter, which is used in the open-circuit-voltage-method SoC estimation part 4 and the error estimation part 6, will be explained.

In the Kalman filter of the open-circuit-voltage-method SoC estimation part 4, the battery equivalent circuit model of the battery B is inputted with the same input (the discharge-and-charge current, the terminal voltage, the temperature and so on) as one inputted to the actual battery B, and the outputs (the terminal voltages) are compared with each other. If there is a difference therebetween, the difference is multiplied by a Kalman gain and the battery equivalent circuit model is feedbacked and modified so that the difference becomes to be the minim value. This operation is sequentially repeated to estimate the open circuit voltage value and others as true inner state quantities.

In the Kalman filter of the error estimation part 6, the error difference estimated by using the error model is compared with the subtracter value of the SoC obtained by the subtracter 5. If there is a difference therebetween, the difference is multiplied by a Kalman gain and the estimate error is feedbacked and modified so that the error becomes to be the minimum value. This operation is sequentially repeated to estimate the true error of the SoC.

In the Kalman filter, the following discrete system is used.

$$\begin{cases} x_{k+1} = Fx_k + v_k \\ y_k = Hx_k + W_k \end{cases} \quad \text{<Eq. 2>}$$

where the additional character k is time. In the above-described equation,
<Eq. 3>

| STATE VARIABLE | $x = [n_i \ n_v]^T$ |
|---|---|
| OBSERVED VALUE | $y = SOC_v - SOC_i$ |
| STATE VARIABLE | $F = \begin{pmatrix} 1 & 0 \\ 0 & 1 \end{pmatrix}$ |
| OUTPUT MATRIX | $H = (-1 \ 1)$ |
| PROCESS NOISE | $v \sim N(0, Q)$ |
| DETECTION-PART NOISE | $w \sim N(0, R)$ |

Herein, the process noise and the noise at the detection parts are normal white noise of the mean value 0 and the variances Q, R, and they are expressed by the following equation by using the variances $Q_i$, $Q_v$ respectively obtained by the current-integration-method SoC estimation part 3 and the open-circuit-voltage-method SoC estimation part 4.

$$Q = [Qi \ 0 \ 0 \ Qv] \quad \text{<Eq. 4>}$$

In the embodiment, it becomes a variable value because it is calculated by using the variances calculated the current-integration-method SoC estimation part 3 and the open-circuit-voltage-method SoC estimation part 4.

Accordingly, it is possible to estimate the error that is allowed for sequential estimate accuracy (the values of variances) of the current-integration-method SoC estimation part 3 and the open-circuit-voltage-method SoC estimation part 4 which are at an upstream side of the error estimation part 6, and therefore the SoC can be estimated with a higher degree of accuracy.

The Kalman filter uses the algorism using the following equations.
<Eq. 5>

$$K_k = P_{k1}H^T(HP_{k-1}H^T + R)^{-1} \quad \text{<Eq. 1>}$$

$$x_k = F(x_{k-1} + K_k(y_k - H^T x_{k-1})) \quad \text{<Eq. 2>}$$

$$P_k = F(P_{k-1} - K_k K_k H^T P_{k-1})F^T + Q \quad \text{<Eq. 3>}$$

where $K_k$ is the Kalman gain, $X_k$ is a mean estimate value, and $P_k$ is estimated variance.

Figure 4:
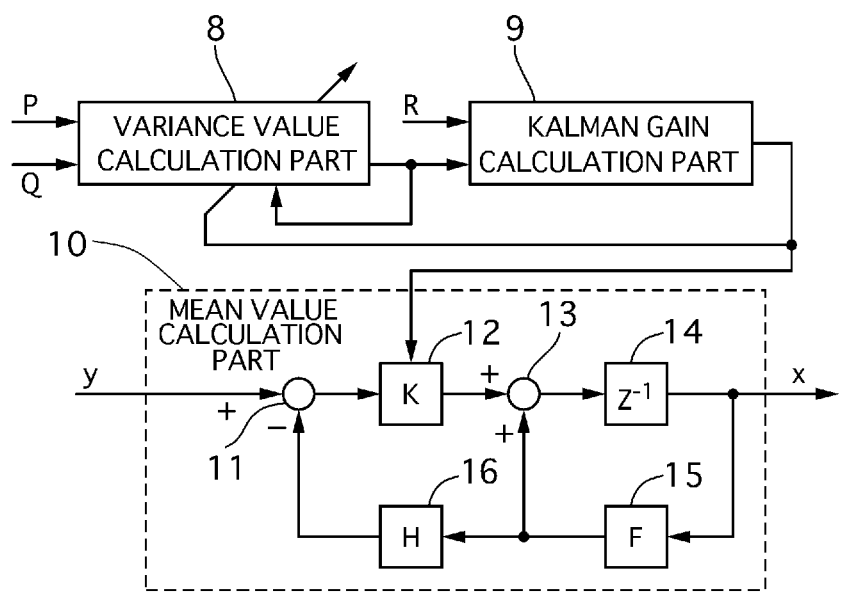
FIG. 4 is a block diagram showing a construction of a Kalman filter that is used the battery SoC estimation device of the first embodiment.

As shown in FIG. 4, the Kalman filter has a variance-value calculation part 8, a Kalman gain calculation part 9, and a mean-value calculation part 10.

The variance-value calculation part 8 is inputted with the covariance matrix P, the variance value as the output value outputted from the variance-value calculation part 8, and the Kalman gain outputted from the Kalman gain calculation part 9 to estimate the estimated variance $P_k$, using the above-described equation of Eq. 3.

The Kalman gain calculation part 9 is inputted with the estimated variance value $P_k$ inputted from the variance value estimation part 8 and the nominal white noise R to calculate the Kalman gain K, using the above-described equation of Eq. 1.

The mean-value calculation part 10 has a subtracter 11, a multiplier 12, an adder 13, a delay part 14, a multiplier 15, and a multiplier 16. It calculates the state variable x based on the observed value y (=$SoC_v$–$SoC_i$) inputted from the subtracter 5 and the Kalman gain K obtained by the Kalman gain calculation part 9, using the above-described equation of Eq. 2.

The subtracter 10 of the mean-value calculation part 10 subtracts the output value of the multiplier 16 from the inputted observed-value y.

The multiplier 12 multiplies the Kalman gain K obtained by the Kalman gain calculation part 9 by the output value of the subtracter 11.

The adder 13 adds the output value of the multiplier 12 and the output value of the multiplier 15 to output the additional value to the delay part 14. The delay part 14 obtains the additional value, as the state variable x, immediately before the present one, by multiplying the additional value of the adder 13 by 1/z.

The multiplier 15 obtains the multiplication value by multiplying the state matrix F by the state variable x inputted from the delay part 14 to output the multiplication value to the multiplier 16.

The multiplier 16 obtains the multiplication value by multiplying the output matrix H by the output value of the multiplier 15 to output the multiplication value to the subtracter 11.

Incidentally, as the Kalman filter originally and sequentially calculates the mean estimate value and variance when it estimates the state quantities of the battery B, it is not necessary to separately calculate them.

The subtracter 7 subtracts the estimate error $n_i$ obtained by the error estimation part 6 from the current-integration-method SoC ($SoC_i$) estimated by the current-integration-method SoC estimation part 3 to obtain the SoC of the battery B. The subtracter 7 corresponds to a state-of-charge calculation means of the invention.

The operation of the SoC calculation device of the first embodiment is as follows.

The discharge-and-charge current value I of the battery B and the terminal voltage value V thereof are sequentially detected by the discharge-and-charge current detection part 1 and the terminal voltage detection part 2 during the activation of the SoC calculation device. Incidentally, these detected values are transformed from analog values to digital values, then the digital values being used for digital computation.

The current-integration-method SoC estimation device 3 obtains the current-integration-method SoC ($SoC_i$) and this variance $Q_i$ based on the discharge-and-charge current value I, the pre-given information (variation) of the discharge-and-charge current detection part 1, and the SoC obtained by the subtracter 7.

On the other hand, the open-circuit-voltage-method SoC estimation part 4 obtains the open-circuit-voltage-method SoC ($SoC_v$) and this variance $Q_v$ based on the discharge-and-charge current value I, the terminal voltage V, and the pre-given information (variance) of the discharge-and-charge current detection part 1 and the terminal voltage detection part 2, using the Kalman filter.

The error estimation part 6 is inputted with the variances $Q_i$, $Q_v$, which are respectively obtained by the current-integration-method SoC estimation device 3 and the open-circuit-voltage-method SoC estimation part 4, and the observed value y (=$SoC_v$–$SoC_i$) to estimate the estimate error $n_i$ of the current-integration-method SoC ($SoC_i$), using the Kalman filter.

The subtracter 7 subtracts the estimate error $n_i$ as noise from the current-integration-method SoC ($SoC_i$) obtained by the current-integration-method SoC estimation part 3 to obtain the SoC of the battery B.

Figure 5:
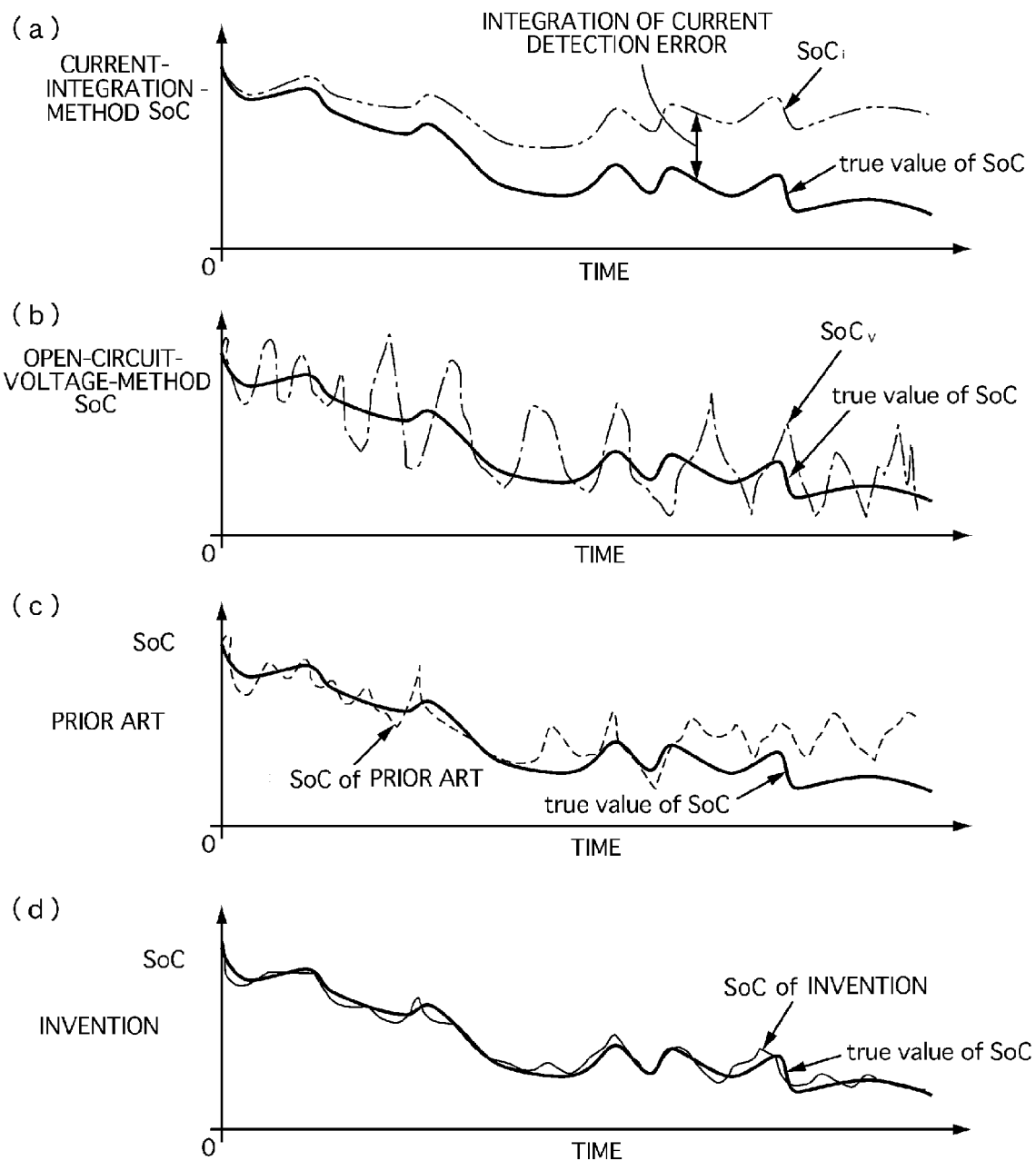
FIG. 5 is graphs showing time variations of the SoC that is obtained by the battery SoC estimation device of the first embodiment, (a) being a graph showing the time variation the SoC that is obtained by using a current integration method, (b) being a graph showing the time variation of the SoC that is obtained by using an open circuit voltage method, (c) being a graph showing the time variation of the SoC that is obtained by using the prior art, and (d) being a graph showing the time variation of the SoC that is obtained by using the battery SoC estimation device of the first embodiment.

Herein, FIG. 5 shows results of the time variation of the estimated SoC of the SoC calculation device of the first embodiment and one of the prior art (disclosed in the Patent Reference 1).

Incidentally, in FIG. 5, (a) shows the time variation of the SoC obtained by using the current integration method, (b) shows the time variation of the SoC obtained by using the open circuit voltage method, (c) shows the time variation of the SoC obtained by using the method of the prior art, and (d) shows the time variation of the SoC obtained by using the SoC calculation device of the first embodiment.

As shown in FIG. 5(a), it is understood that the estimate value of the SoC, which is obtained by using the current integration method, departs from the true value of SoC t a larger extent, the error being accumulated, as the time elapses.

In addition, as shown in FIG. 5(b), the error between the estimate value of the open-circuit-voltage-method SoC does not become larger as the time elapses, but the estimate value constantly becomes larger and smaller to depart to a large amount from the true value of SoC for a short period.

Further, as shown in FIG. 5(c), the SoC obtained by using the prior at method is compensated to become smaller than those obtained by using the current integration method and the open circuit voltage method. The current value, however, is compensated based on the voltage value, and accordingly it cannot be free from the influence of the voltage value. Consequently the variation of the discharge-and-charge current detection part cannot be sufficiently compensated, and the error becomes larger as the time elapses.

On the other hand, as shown in FIG. 5(d), it is understood that, in the SoC estimation device of the first embodiment, the variation of the voltage value and the variation of the discharge-and-charge current detection part 1 are sufficiently absorbed, so that the error can be suppressed to a small amount relative to that of the prior art and it does not increase as the time elapses.

Figure 6:
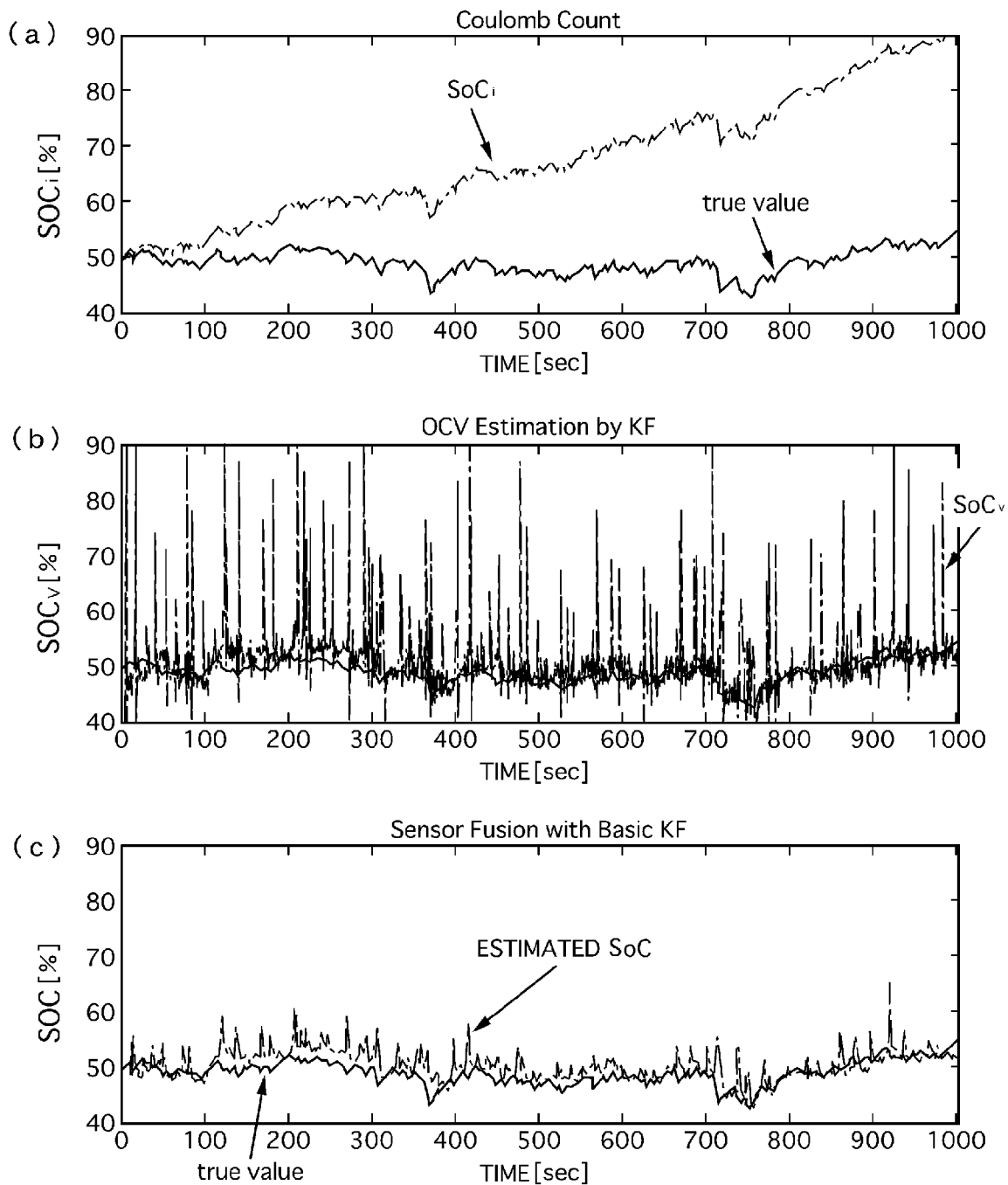
FIG. 6 is graphs showing the results from a simulation carried out by the battery SoC estimation device of the first embodiment, (a) being a graph showing a comparison between the SoC that is obtained by the current-integration-method SoC calculating part and the corresponding true value, (b) being a graph showing a comparison between the SoC that is obtained by the open-circuit-voltage-method SoC estimation part and the corresponding true value, and (c) being a graph showing a comparison between the SoC that is obtained by an SoC calculation part that is used in the battery SoC estimation device of the first embodiment and the corresponding true value.

Next, FIG. 6 shows the comparative results of the simulation between the SoC estimated by the SoC estimation device of the first embodiment and the true value of SoC.

The current-integration-method SoC ($SoC_i$) estimated by the current-integration-method SoC estimation part 3 departs to a larger amount as the time elapses as shown in FIG. 6.

On the other hand, the open-circuit-voltage-method SoC ($SoC_v$) estimated by the open-circuit-voltage-method SoC estimation part 4 does not depart to a larger content as the time elapses, but it constantly varies to a large content for a short time, so that a large error frequently occurs.

However, in the SoC estimation device of the first embodiment, the current-integration-method SoC estimation part 3 and the open-circuit-voltage-method SoC estimation part 4 allow for the mean values and the variances, and the error estimation part 6 and the subtracter 7 obtain the SoC. Therefore, a deviation from the true value, namely the error is small, and it does not depart to a larger amount as the time elapses. That is, it is understood that the SoC estimation device of the first embodiment can estimate the SoC with a high degree of accuracy.

As explained above, the SoC estimation device of the first embodiment can obtain the following advantages.

In the SoC estimation device of the first embodiment, when the current-integration-method SoC (SoC$_i$) and the open-circuit-voltage-method SoC (SoC$_v$) are respectively calculated by the current-integration-method SoC estimation device 3 and the open-circuit-voltage-method SoC estimation device 4, they are statistically computed, using the mean value and the variance, to estimate the estimate error, so that the SoC is calculated. Therefore, the SoC of the battery B can be calculated with a higher degree of accuracy relative to that of the prior art even when the discharge-and-charge current detection part 1 and the terminal voltage detection part 2 have the variation or the variability in their characteristics.

In addition, the open-circuit-voltage-method SoC estimation part 4 and the error estimation part 6 uses the Kalman filters, respectively. Therefore, the state quantities of the battery B can be easily and with a high degree of accuracy estimated. The Kalman filters originally and sequentially calculate the mean estimate value and estimated variance value, and accordingly it is not necessary to separately calculate these values.

Further, the current-integration-method SoC estimation part 3 estimates the current-integration-method SoC (SoC$_i$) based on the SoC obtained by the subtracter 7. Therefore, the current-integration-method SoC (SoC$_i$) can be estimated with a high degree of accuracy.

Figure 7:
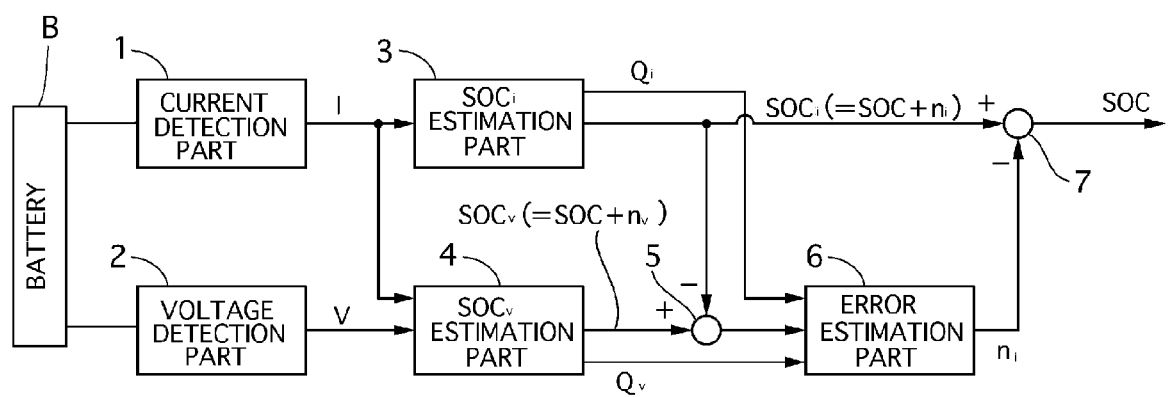
FIG. 7 is a block diagram showing a construction of a battery SoC estimation device of a second embodiment according to the present invention.

Next, a battery SoC estimation device according to a second embodiment of the present invention will be described with reference to FIG. 7. Incidentally, in the second embodiment, the parts/portions similar to those of the first embodiment are indicated by the same reference numbers, and their explanation will be omitted.

In the first embodiment shown in FIG. 1 the SoC as the output value of the subtracter 7 is inputted to the delay part 32 of the current-integration-method SoC estimation part 3, while, in the battery SoC estimation device of the second embodiment, the current-integration-method SoC (SoC$_i$) as an output value of a current-integration-method SoC estimation part 3 is inputted to a delay part 32 instead of the SoC of the subtracter 7.

The other construction is the same as that of the first embodiment.

Thus, the current-integration-method SoC (SoC$_i$) outputted from the current-integration-method SoC estimation part 3 is inputted to the delay part 32 of the current-integration-method SoC estimation part 3, which can decrease the error of the SoC relative to that in the prior art although the error becomes somewhat larger than that of the first embodiment.

While there have been described with reference to embodiments, to which the invention is not limited. The invention includes a design change and modification as long as they do not depart from the subject-matter of the invention.

For example, in the invention, although the noise matrix Q is the variable value, it may be a fixed value as in the conventional Kalman filter. In this case, it can obtain the estimate accuracy higher than that in the prior art although its estimate accuracy slightly decreases relative to that using the variable value.

DESCRIPTION OF REFERENCE NUMBERS 1 discharge-and-charge current detection part (discharge-and-charge current detection means)
2 terminal voltage detection part (terminal voltage detection means)
3 current-integration-method State-of-Charge estimation part (current-integration-method State-of-Charge estimation means)
3A State-of-Charge calculation part
3B current-integration-method variance calculating part
4 open-circuit-voltage-method State-of-Charge estimation part (open-circuit-voltage-method State-of-Charge estimation means
4A open-circuit-voltage estimation part
4B State-of-Charge calculation part
4C delay part
4D open-circuit-voltage-part condenser-capacity calculation part
5 subtractor
6 error estimation part (error estimation means)
7 subtractor (State-of-Charge calculation means)
8 variance calculation means
9 Kalman gain calculation part
10 mean value calculation part
B battery

The invention claimed is:

1. A battery State-of-Charge estimation device comprising:
a discharge-and-charge current detection means that detects a discharge-and-charge current value of a battery;
a terminal voltage detection means that detects a terminal voltage value of the battery,
a current-integration-method State-of-Charge estimation means that estimates a current-integration-method State-of-Charge based on a State-of-Charge obtained by integrating the discharge-and-charge current value inputted from the discharge-and-charge current detection means and a State-of-Charge obtained at previous time, calculating a variance of the current-integration-method State-of-Charge based on information on a detection accuracy of the discharge-and-charge current detection means;
an open-circuit-voltage method State-of-Charge estimation means that estimates an open-circuit-voltage State-of-Charge based on the discharge-and-charge current value inputted from the discharge-and-charge current detection means and the terminal voltage value inputted from the terminal voltage detection means, using a battery equivalent circuit model, the open-circuit-voltage method State-of-Charge estimation means calculating a variance of the open-circuit-voltage method State-of-Charge based on information of detection accuracy of the discharge-and-charge current detection means and the terminal voltage detection means;
an error estimation means that estimates an estimate error of the current-integration-method State-of-Charge based on a difference between the open-circuit-voltage method State-of-Charge and the current-integration-method State-of-Charge, the variance open-circuit-voltage method State-of-Charge of current-integration-method State-of-Charge, and the variance of; and
a State-of-Charge calculating means that calculates a State-of-Charge of the battery based on the current-integration-method State-of-Charge and the estimate error estimated by the error estimation means.

2. The battery State-of-Charge estimation means according to claim 1, wherein
the open-circuit-voltage-method State-of-Charge estimation means and the error estimation means use a Kalman filter, respectively.

3. The battery State-of-Charge estimation means according to claim 1, wherein
the current-integration-method State-of-Charge estimation means estimates the current-integration-method State-of-Charge, using the State-of-Charge that is previously obtained by the State-of-Charge calculating means.

4. The battery State-of-Charge estimation means according to claim 2, wherein
the current-integration-method State-of-Charge estimation means estimates the current-integration-method State-of-Charge, using the State-of-Charge that is previously obtained by the State-of-Charge calculating means.

* * * * *